United States Patent [19]
Hower et al.

[11] Patent Number: 5,700,725
[45] Date of Patent: Dec. 23, 1997

[54] APPARATUS AND METHOD FOR MAKING INTEGRATED CIRCUITS

[75] Inventors: Glenn Roy Hower, Allen Township, Northampton County; Henry Y. Kumagai, Orefield, both of Pa.

[73] Assignee: Lucent Technologies Inc., Murray Hill, N.J.

[21] Appl. No.: 789,892

[22] Filed: Jan. 29, 1997

Related U.S. Application Data

[63] Continuation of Ser. No. 494,429, Jun. 26, 1995, abandoned.

[51] Int. Cl.$^6$ .......................... H01L 21/00; H01L 21/318
[52] U.S. Cl. .................. 437/225; 437/228; 437/241; 427/569; 427/579; 118/723 E; 118/728; 118/500; 156/345; 156/643.1; 204/298.15
[58] Field of Search ...................... 118/723 E, 728, 118/500; 269/21, 900; 204/298.15; 437/225, 228, 241; 427/569, 579; 156/345, 643.1

[56] References Cited

U.S. PATENT DOCUMENTS

| | | | |
|---|---|---|---|
| 4,213,698 | 7/1980 | Firtion | 355/77 |
| 4,624,728 | 11/1986 | Bithell et al. | 156/345 |
| 4,667,076 | 5/1987 | Amada | 219/10.55 M |
| 4,672,914 | 6/1987 | Sari | 118/641 |
| 4,684,113 | 8/1987 | Douglas | 269/21 |
| 4,724,222 | 2/1988 | Feldman | 437/173 |
| 4,781,511 | 11/1988 | Harada | 414/217 |
| 4,872,947 | 10/1989 | Wang et al. | 156/643 |
| 4,989,846 | 2/1991 | Quinn | 260/54.5 |
| 5,148,714 | 9/1992 | McDiarmid | 74/89.15 |
| 5,152,707 | 10/1992 | Dougherty | 445/52 |
| 5,228,052 | 7/1993 | Kikuchi | 373/18 |
| 5,275,326 | 1/1994 | Fiedler | 228/47.1 |
| 5,332,442 | 7/1994 | Kubodera | 118/725 |
| 5,374,829 | 12/1994 | Sakamoto | 250/453.11 |
| 5,456,756 | 10/1995 | Ramaswami | 118/721 |
| 5,462,603 | 10/1995 | Murakami | 118/719 |
| 5,620,523 | 4/1997 | Maeda et al. | 118/723 IR |

FOREIGN PATENT DOCUMENTS

| | | | |
|---|---|---|---|
| 0456426 A1 | 11/1991 | European Pat. Off. | 118/500 |
| 230714 A3 | 12/1985 | German Dem. Rep. | 118/728 |
| 281887 A5 | 8/1990 | German Dem. Rep. | 118/500 |
| 3942931 A1 | 6/1990 | Germany | 118/728 |

*Primary Examiner*—Richard Bueker
*Assistant Examiner*—Jeffrie R. Lund
*Attorney, Agent, or Firm*—John T. Rehberg

[57] ABSTRACT

An improved apparatus and method for the manufacture of integrated circuits is disclosed. At least three protrusions extend from the wafer support susceptor. The protrusions slightly electrically decouple the wafer from the susceptor during plasma processing. The protrusions prevent gradual debris build-up on the susceptor from causing variation from lot-to-lot in plasma processing results.

8 Claims, 2 Drawing Sheets

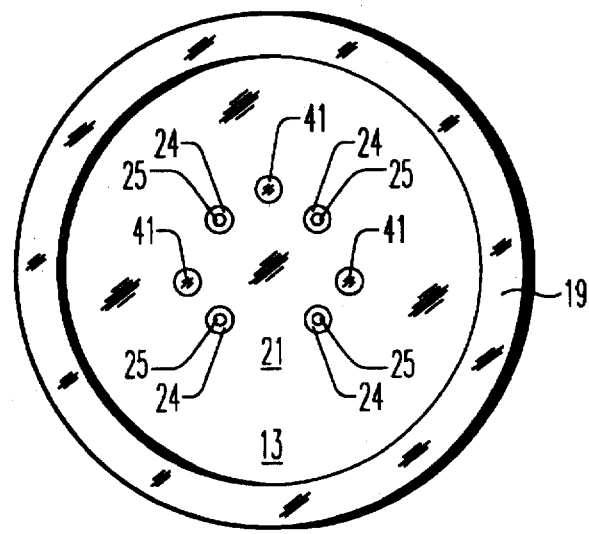
FIG. 4
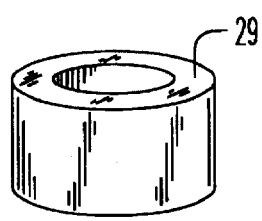
FIG. 5
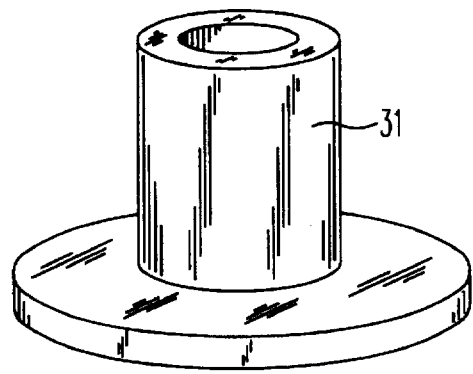
FIG. 6
FIG. 7
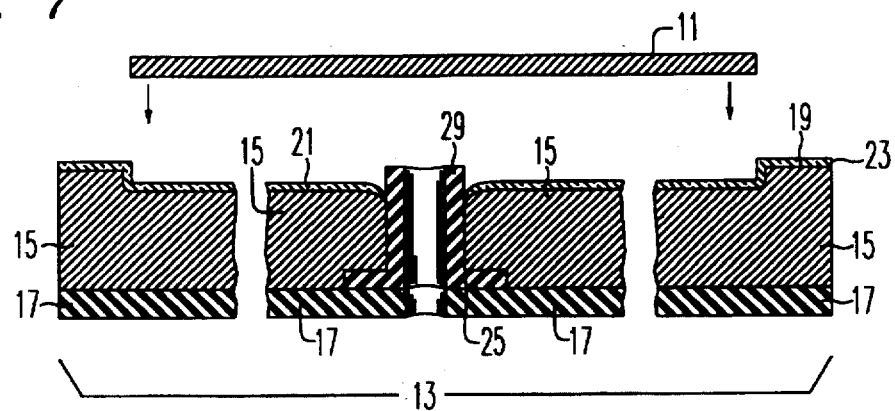

APPARATUS AND METHOD FOR MAKING INTEGRATED CIRCUITS

This is a continuation of application Ser. No. 08/494,429, filed Jun. 26, 1995, now abandoned.

TECHNICAL FIELD

This invention relates to methods and apparatus for semiconductor integrated circuit fabrication.

BACKGROUND OF THE INVENTION

The popularity of so-called "single wafer machines" for deposition and etching has increased in recent years. In one popular machine, manufactured by Applied Materials Corporation, Santa Clara, Calif., a wafer is placed on a flat plate turn based susceptor. The wafer, while on the susceptor, is exposed to an environment, typically a plasma environment, in which either deposition or etching occurs. An example of a plasma-processing apparatus is found in U.S. Pat. No. 4,872,947, issued to Wang, and incorporated herein by reference.

Typically, plasma processes are utilized to deposit dielectrics such as silicon nitride and silicon dioxide. Those concerned with the development of integrated circuits have consistently sought methods and apparatus for depositing layers upon substrates in a production environment. It is desired that the deposition process be as consistent as possible from wafer to wafer.

SUMMARY OF THE INVENTION

Accordingly, an improved apparatus and method for making integrated circuits is disclosed. The apparatus includes:

a generally flat plate having a first surface;

at least three raised protrusions extending from said plate, said protrusions being capable of supporting a wafer; and apparatus for plasma processing said wafer while it is supported by said protrusions.

An improved method of integrated circuit manufacture includes: supporting a wafer upon at least three protrusions, said protrustions extending from a flat plate; and performing a plasma process upon said wafer while it is supported by said protrusions.

BRIEF DESCRIPTION OF THE DRAWING

FIG. 4 is a plan view of an alternate embodiment susceptor;

FIG. 5 is a bushing of the type inserted in the preferred embodiment susceptor of FIG. 3;

FIG. 6 is an alternate bushing replacing the prior art bushing in the alternate embodiment susceptor of FIG. 7; and, FIG. 7 is a cross-section of an alternate embodiment susceptor.

DETAILED DESCRIPTION

Figure 1:
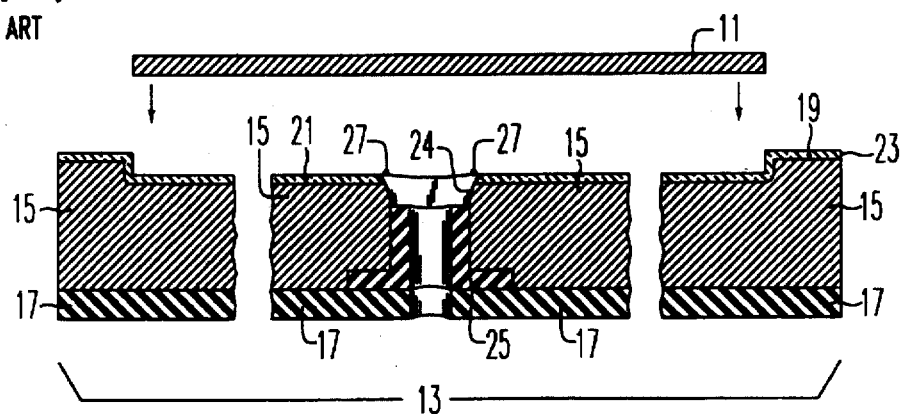
FIG. 1 is a cross-sectional drawing along line 1—1 of a typical prior art susceptor shown in FIG. 3.
Figure 3:
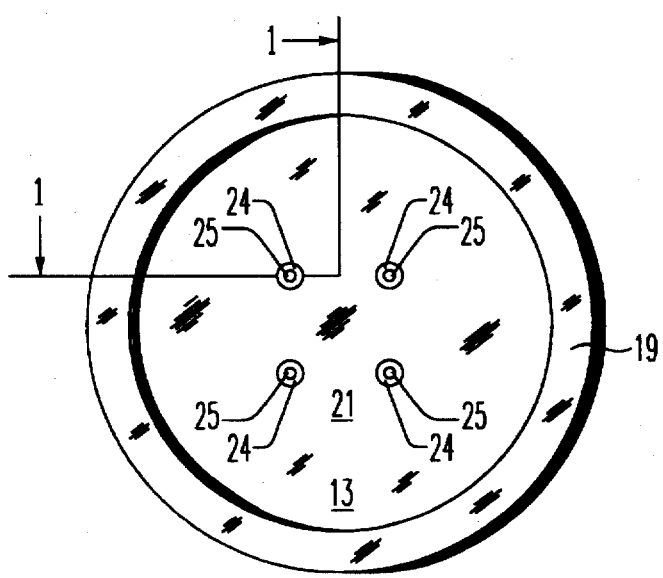
FIG. 3 is a plan view of a typical prior susceptor.

FIGS. 1 and 3 show a typical susceptor utilized in dielectric deposition. Susceptor 13 has a raised portion 19 on its periphery. Recessed portion 21 is positioned below raised portion 19 to receive a semiconductor wafer (reference numeral 11, FIG. 1). There are four openings 24 in recessed portion 21 of susceptor 13. As illustrated more clearly in FIG. 1, each opening 24 contains a bushing 25. Bushing 25 protrudes upward through hole 24 but does not extend completely to the top of recessed surface 21. Susceptor 13 is comprised of an anodized aluminum plate 15 and an underlying ceramic support 17.

Susceptor 13 may be dimensioned to receive 4", 5", 6", or 8" wafers. Applicants have noticed that when susceptor 13 is dimensioned to receive 4" wafers and a plasma enhanced chemical vapor deposition process for silicon nitride is employed, the film properties change during the production deposition process. Specifically, applicants have noticed that silicon nitride films deposited upon wafers which are positioned upon a new susceptor exhibit a (deskable) compressive stress. After a few hundred wafers have been processed on a particular susceptor, the compressive stress of the deposited silicon nitride films gradually reduces. Eventually, the wafers which receive silicon nitride films on the same susceptor exhibit zero stress in the silicon nitride film. After a further period of time, wafers processed on the same susceptor exhibit an undesirable tensile stress. This observed change in the stresses of deposited silicon nitride films utilizing the same susceptor (and using the same deposition process parameters) over a period of time is undesirable. It is desirable that each wafer have nearly the same stress as all the other wafers processed utilizing the same susceptor.

The manufacturing process utilized to deposit silicon nitride requires that, after a wafer is covered with a silicon nitride film and removed from the deposition chamber, a plasma cleaning process utilizing $CF_4$ and oxygen is performed. Applicants hypothesize that the cleaning cycle tends to break down the anodized coating 23 on the upper surface of susceptor 13. Furthermore, it is believed that the cleaning process tends to form small bumps of aluminum fluoride 27 on the upper periphery of holes 24. These small bumps 27 prevent the next wafer 11 from resting flat on the recessed surface 21 of susceptor 13.

Since the cleaning cycle is performed after each wafer has been processed, it is believed that bumps 27 slowly grow on the upper surface 21 of susceptor 13. Wafers which are placed upon susceptor 13 after bumps 27 have become too large do not have the benefit of same RF coupling that wafers which are placed on susceptor 13 early in the production process enjoy. Thus, stress observed in the later-processed wafers may be different than the stress observed in films of wafers processed earlier.

Figure 2:
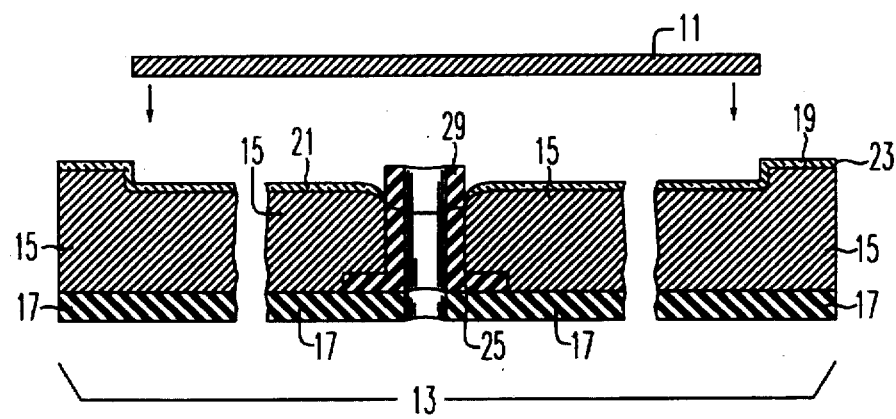
FIG. 2 is a cross-sectional drawing of the preferred embodiment susceptor.

Applicants' experiments have illustrated that the problem is alleviated by inserting bushings 29, depicted in FIG. 5 in opening 24 of susceptor 13. In FIG. 2, bushing 29 rests upon bushing 25. Bushing 29 protrudes above surface 21 of susceptor 13 preferably each of four openings 24. Bushings 29 support wafer 11. In other words, wafer 11 does not rest flat upon surface 21 of susceptor 13. Thus, when the present invention is utilized, if bumps or protrusions 27 should develop during a cleaning cycle, bushing 29, which extends further above surface 21 of susceptor 13, will support wafer 11 despite the presence of bump 27. Consequently, all wafers 11 in a particular production cycle are spatially decoupled by the same distance (due to bushing 29) from the dc bias supplied to susceptor 13. Thus, each wafer 11 is processed under nearly identical conditions. Applicants' experiments have shown that wafers which are processed utilizing the present invention exhibit uniform stress properties over hundreds of wafers. (Some increase in total RF power may be necessary to compensate for reduced wafer electrical coupling.)

An alternative embodiment of the present invention is depicted in FIG. 7. In FIG. 7, bushings 25 and 29 have been replaced by a single bushing 31, also depicted in FIG. 6, which extends approximately 0.005 inches above surface 21 of susceptor 13. Other dimensions may also be chosen by those skilled in the art. (0.002 to 0.007 being most likely) Of course, each bushing should be the same size to insure uniform electrical coupling of the wafer to the susceptor. Thereby insuring that the wafer surface is parallel to the susceptor.

Another embodiment of the present invention is depicted in FIG. 4. In FIG. 4, the original configuration of openings 24 is not changed. However, three solid cylindrical (or hollow cylindrical) supports designated by reference numeral 41 are positioned upon the upper surface of recessed portion 21 of susceptor 13. Protrusions or supports 41 may be formed integrally with susceptor 13. Alternatively, protrusions or supports 41 may be formed by drilling a blind hole in susceptor 13 and positioning ceramic supports within the blind holes. As before, it is desirable that support 41 extend upward beyond upper surface 21.

The invention may be used with a variety of apparatus used to process wafers including the apparatus of the aforementioned Wang reference. For example, it may be used with plasma processing apparatus (including apparatus which employ microwaves or electron cyclotron resonances). The invention may also be used in apparatus with multiple susceptors such as those manufactured by Novellus, Inc.

The invention claimed is:

1. A method of integrated circuit manufacture comprising:
   supporting a wafer upon at least three protrusions, said protrusions extending from a flat plate and spacially decoupling said wafer from a dc bias supplied to said flat plate;
   performing a plasma process upon said wafer while it is supported by said protrusions;
   removing said wafer from said protrusions after completion of said plasma process; and
   performing a cleaning process upon said plate.

2. The method of claim 1 in which said plasma process is a chemical vapor deposition process.

3. The method of claim 2 in which said chemical vapor deposition process is a process for depositing silicon nitride.

4. The method of claim 1 in which said cleaning process is a plasma cleaning process utilizing $CF_4$ and oxygen.

5. The method of claim 1 in which said protrusions extend between 0.002 and 0.007 inches above said plate.

6. The method of claim 1 in which said protrusions are made from ceramic material.

7. The method of claim 1 in which said protrusions are bushings inserted within holes in said plate.

8. A method of integrated circuit processing comprising:
   supporting a wafer upon at least three ceramic protrusions, said protrusions extending between 0.002 and 0.007 inches from a flat plate;
   performing a plasma deposition of a layer of silicon nitride upon said wafer;
   removing said wafer from said protrusions after completion of said plasma process;
   performing a cleaning process upon said plate, said cleaning process utilizing $CF_4$ and oxygen in a plasma.

* * * * *